United States Patent [19]

Matsushita

[11] 3,731,123

[45] May 1, 1973

[54] MAGNETIC FIELD DETECTING APPARATUS

[75] Inventor: Takeshi Matsushita, Kanagawa, Japan

[73] Assignee: Sony Corporation, Tokyo, Japan

[22] Filed: Mar. 21, 1972

[21] Appl. No.: 236,776

Related U.S. Application Data

[63] Continuation-in-part of Ser. No. 888,377, Dec. 29, 1969, abandoned, and a continuation-in-part of Ser. No. 873,399, Nov. 3, 1969, abandoned, and a continuation-in-part of Ser. No. 873,162, Nov. 3, 1969, abandoned.

[30] Foreign Application Priority Data

| | | |
|---|---|---|
| Nov. 5, 1968 | Japan | 43/80836 |
| Nov. 5, 1968 | Japan | 43/80837 |
| Dec. 28, 1968 | Japan | 43/858 |

[52] U.S. Cl. ..........307/309, 317/235 H, 317/235 Y, 317/235 AD, 317/235 AQ, 317/235 R, 317/235 AT

[51] Int. Cl. ..........H01l 5/00, H01l 9/10, H01l 13/00

[58] Field of Search ..................317/235 H; 307/309

[56] References Cited

UNITED STATES PATENTS 3,668,439 6/1972 Fujikawa et al. ..................307/309

*Primary Examiner*—John W. Huckert

*Assistant Examiner*—William D. Larkins

*Attorney*—Lewis H. Eslinger et al.

[57] ABSTRACT

A magnetic field detecting apparatus comprises a semiconductor substrate, preferably of a substantially intrinsic material, having at least first, second and third spaced apart regions of relatively high impurity concentration formed therein, with the first and second regions being of opposite conductivity types and forwardly biased by connection to a voltage source for injecting respective carriers, for example, holes and electrons, and for supplying a main current along a path between the first and second regions which are spaced from each other by a distance greater than the sum of the diffusion lengths of the carriers injected at the first and second regions, respectively. The third region is of the same conductivity type as the first region and reverse biased, preferably through the output region connected to the second and third regions, so as to be adapted for collecting the carriers injected by the first region, and the third region is closer to the first region than to the second region and spaced from the path of the main current by a distance which, in the absence of any magnetic field, is greater than the diffusion length of the carriers injected at the first region so that the output circuit provides an output signal that sensitively corresponds to the strength and direction of any magnetic field to which the substrate is subjected.

7 Claims, 12 Drawing Figures

MAGNETIC FIELD DETECTING APPARATUS

This invention relates generally to magnetic field detecting apparatus, and more particularly is directed to improvements in magnetic field detecting apparatus of the type that includes a semiconductor element providing an electrical output to indicate the presence of a magnetic field. This application is a continuation-in-part of my pending U.S. Pat. application Ser. No. 888,377, filed Dec. 29, 1969, of my pending U.S. Pat. application Ser. No. 873,399, filed Nov. 3, 1969, and of my pending U.S. Pat. application Ser. No. 873,162, filed Nov. 3, 1969, all of which prior applications are now abandoned.

Among the previously proposed arrangements for detecting or measuring magnetic fields are those employing a so-called "Hall generator" which comprises a plate of impurity semiconductor material of N- or P-type conductivity having a pair of ohmic input contacts at spaced apart locations on the Hall plate which are connected to a voltage source for supplying a drive current between such input contacts, and a pair of ohmic output contacts at locations on the Hall plate which are at opposite sides of the path of the drive current. In a Hall generator, a magnetic field directed normal to the surface of the Hall plate results in an electric field at right angles to the path of the drive current, and which is referred to as the "Hall field." The Hall field gives rise to a force which opposes, and finally cancels the force due to the magnetic field. In any case, the electrical Hall field produces a voltage gradient across the plate so that the ohmic output contacts detect different voltages depending on the strength and direction of the magnetic field. In such a Hall generator, the ohmic input and output contacts do not provide rectifying junctions and thus carriers are not injected. Hall generators are characterized by linear responses on magnetic fields so that extremely sensitive and costly meters are required to measure the small output voltages or currents corresponding to the detected fields.

Even when the effective thickness of the Hall plate is substantially reduced, for example, as proposed in British Pat. No. 986,470, published Mar. 17, 1965, or in British Pat. No. 1,006,674, published Oct. 6, 1965, the improvement in sensitivity is not sufficient to make the resulting Hall generator a practically effective apparatus for detecting weak fields.

It has further been proposed to employ a transistor for detecting or measuring magnetic fields, for example, as disclosed in British Pat. No. 805,926, published Dec. 17, 1958. Such transistor is disclosed to comprise a sheet of impurity semiconductor, specifically of N-type conductivity, welded to a base electrode with which it forms a non-rectifying junction, and two electrodes having point contact with the semi-conductor sheet to provide rectifying junctions and being respectively forwardly and reversely biased to form an emitter electrode and a collector electrode, respectively. The emitter electrode injects a current primarily in the form of minority carriers, that is, holes in the case of the semiconductor sheet having N-type conductivity, and the collector electrode, being reversely biased, collects holes. In the disclosed transistor, the distance between the point contacts of the emitter and collector electrodes with the impurity semiconductor sheet or plate is very substantially less than the diffusion length of the holes, for example, such distance is stated to be 0.05 mm. as compared with the accepted diffusion length of 0.2 mm. for holes in N-type germanium as given in "Introduction to Solid State Physics," Charles Kittel, 3rd Edition, John Wiley & Sons, at page 324. Further, the distance between the emitter and base electrodes, determined by the 0.4 mm. thickness of the semiconductor plate, is greater than the emitter to collector distance.

When the above described transistor is employed to detect or measure a magnetic field, the transistor is oriented relative to the magnetic field so that the latter deflects the injected minority carriers (holes) towards the base electrode which thereby catches a portion of the injected holes. Further, by reason of the deflection of the injected holes away from the collector electrode, the probability of the recombination of the injected minority carriers (holes) with the majority carriers (electrons) of the N-type semiconductor plate is increased. The result is a reduction in the current caught by the collector electrode, and measurement of this current reduction provides an indication of the strength of the magnetic field. Although the described transistor arrangement for measuring or detecting magnetic fields has improved sensitivity, as compared with the Hall generator, in respect to relatively low intensity magnetic fields, such transistor arrangement has a negative feedback characteristic which reduces its sensitivity to variations in magnetic fields of relatively high magnitude. The negative feedback results from the fact that the sheet or plate thereof is of an impurity semiconductor material in which a Hall field is produced by reason of the magnetic field. The Hall field yields a force which opposes the deflection of the minority carriers toward the base electrode by the magnetic field. Thus, as the magnetic field intensity is increased to a level at which the Hall effect is appreciable, the force due to the Hall field opposes the deflection of the minority carriers toward the base electrode and the measured change in the collector current is minimized.

Another type of magnetic field detecting apparatus that has been proposed relies for its operation on the Suhl effect and includes a plate of impurity semiconductor material having ohmic contacts at its opposite ends connected to a voltage source for supplying a current through the plate, and being provided with a recombination region, for example, by sandblasting or otherwise roughening a surface of the plate, so that, when the plate is exposed to a magnetic field which deflects the current path toward such recombination zone, the current is reduced and such reduction can be measured as an indication of the magnitude of the magnetic field. However, a magnetic field detecting apparatus employing the Suhl effect is relatively insensitive to weak magnetic fields and is also further subject to negative feedback by reason of the Hall field produced in response to the magnetic field in the impurity semiconductor material and which yields a force opposing the deflection of the carriers toward the recombination region. In order to avoid such negative feedback due to the Hall voltage, it has been proposed in U.S. Pat. No. 3,519,899, having a common assignee herewith, to provide magnetoresistance element of a type which is available from the Sony Corporation under the trademark SMD and in which a plate of intrinsic or substantially intrinsic semiconductor material is provided with regions of relatively high impurity concentrations at its opposite ends. Such regions are of opposite conductivity types and are connected to a voltage source to respectively inject holes and electrons into the intrinsic plate which further has a recombination region formed at one of its surfaces. In the foregoing arrangement, the positive injection of the holes and electrons into the substantially intrinsic semiconductor plate substantially lowers the negative feedback due to the Hall field. Although SMD magnetoresistance elements are several hundred to several thousand times as sensitive as Hall generators, the formation of the recombination region on a surface of the semiconductor plate involves an undesirable complication in the manufacturing procedure therefor. Further, SMD magneto-resistance elements are adapted for use only in applications where the applied magnetic fields do not have intensities exceeding about +5kOe as the output signal becomes saturated, that is, does not exhibit further change, when the element is subjected to fields having intensities substantially above the stated value.

In another known device, for example, as disclosed in U.S. Pat. No. 3,324,297, which is intended to be photosensitive or responsive to radiation energy of corpuscular nature, a photosensitive strip of practically intrinsic or weakly extrinsic semiconductor material is provided, at one end, with spaced regions of P- and N-type conductivity which are respectively biased to inject holes and to collect electrons. The impurity regions are arranged so that the holes traveling between the P-type regions and the electrons traveling between the N-type regions traverse a substantially common current path intermediate the ends of the substantially intrinsic semiconductor strip. The impedance or resistance of the substantially intrinsic zone, and hence the resistance to movement of the holes and electrons in the substantially common current path, is influenced by the incident radiation of corpuscular nature and determines the rate of recombination of the holes and electrons and the magnitude of the measured current. However, if the foregoing device is exposed to a magnetic field, as distinguished from radiant energy of corpuscular nature, the influence of the magnetic field on the resistance or impedance of the intrinsic zone of semiconductor material is very small so that such device is only very slightly, if at all, sensitive to a magnetic field.

Accordingly, it is an object of this invention to provide a magnetic field detecting apparatus which is highly sensitive to magnetic fields over a wide range of magnetic field strengths.

Another object is to provide a magnetic field detecting apparatus, as aforesaid, which is relatively easily manufactured by means of existing techniques employed for the production of semiconductor devices.

In accordance with an aspect of this invention, a magnetic field detecting apparatus comprises a semiconductor substrate, preferably of substantially intrinsic material, having at least first, second and third spaced apart regions of relatively high impurity concentration formed therein, the first and third regions being of the same conductivity type and said second region being of the opposite conductivity type, a voltage source connected with the first and second regions for forwardly biasing each of the first and second regions so that respective carriers are injected at the first and second regions and a main current flow is established along a path between the first and second regions, such first and second regions being spaced apart by a first distance greater than the sum of the diffusion lengths of the carriers injected at the first and second regions, respectively, and output circuit means connected with the second and third regions for reversely biasing the third region so that the latter is adapted to collect the carriers injected at the first region and for providing an output voltage between the second and third regions that corresponds to the strength and direction of any magnetic field to which said substrate is subjected, the third region being closer to the first region than to the second region and being spaced from said path of the main current flow by a second distance which, in the absence of any magnetic field, is greater than the diffusion length of the carriers injected at said first region.

In order to further enhance the sensitivity of the magnetic field detecting apparatus according to this invention, all of the aforesaid high impurity concentration regions may extend from one surface of the semiconductor substrate and an additional impurity region extends in the substrate from the opposed surface of the substrate to limit the thickness of the flow path afforded to the carriers in the substrate to less than the thickness of the latter.

Further, in a magnetic field detecting apparatus according to this invention, as aforesaid, the substantially intrinsic substrate may be provided with a fourth region of relatively high impurity concentration which is of the same conductivity type as the second region and located closer to the latter than to the first region, with the distance of the fourth region from the main current path being greater than the diffusion length of the carriers injected at the second region in the absence of a magnetic field, and with the third and fourth regions being electrically connected to each other externally of the substrate and being disposed at opposite sides of the main current path in the substrate.

The above, and other objects, features and advantages of this invention, will be apparent in the following detailed description of illustrative embodiments thereof which is to be read in connection with the accompanying drawings, wherein.

Figure 1:
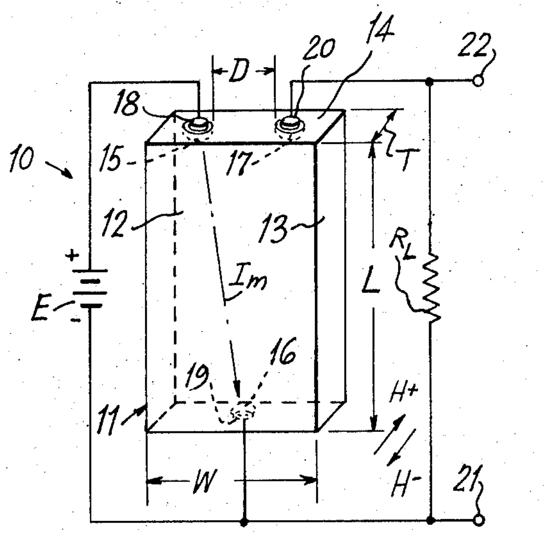
FIG. 1 is an enlarged perspective view schematically illustrating a magnetic field detecting apparatus according to one embodiment of this invention.

Referring to the drawings in detail, and initially to FIG. 1 thereof, it will be seen that a magnetic field detecting apparatus 10 according to this invention comprises a semiconductor element having a semiconductor substrate 11 which may be formed of germanium, silicon or other intermettalic compound forming a relatively low impurity density region. Preferably, the substrate 11 is formed of a high resistance, intrinsic or so-called I-type semiconductor having an impurity concentration of approximately $10^{11}$ atoms/cm.$^3$, but it will be understood that the semiconductor substrate may also be formed of a weakly extrinsic P- or N-type semiconductor having an impurity concentration of about $10^{10}$ to $10^{15}$ atoms/cm.$^3$. In a typical apparatus of the type shown on FIG. 1, the substrate 11 is in the form of a rectangular parallelpiped having a length L of 3 mm., a width W of 1.8 mm. and a thickness T of 0.37 mm. so as to have a major surface 12 and a similar opposed major surface (not shown) of the length L and width W, and which are bounded by opposed long sides 13 and opposed short sides 14. The semiconductor substrate 11 is subjected to etching with an etchant CP-4, rinsed with water and then dried in the usual manner, whereupon, spaced apart first, second and third regions 15,16 and 17 of relatively high impurity concentrations, on the order of approximately $10^{19}$ atoms/cm.$^3$, are formed in substrate 11 by the usual alloying or diffusion techniques. In the illustrated apparatus 10, the first and third impurity regions 15 and 17 are of the P-type, for example, of an indium-tin alloy, and extend into substrate 11 from one of the relatively short sides 14 with a spacing between regions 15 and 17 of about 0.8 mm. The second impurity region 16 extends into substrate 11 from the opposite short side 14 thereof and is, for example, of an antimony-tin alloy, so as to be of the N-type.

First, second and third electrodes 18,19 and 20 are respectively soldered to the impurity regions 15,16 and 17 for the attachment of leads thereto, and the entire semiconductor element may be encased in a molded resin. An electric power source E has its positive and negative terminals respectively connected to the first and second electrodes 18 and 19, as shown, whereby to produce a main current flow $I_m$ in substrate 11, which current flow, in the absence of a magnetic field, is in the direction from impurity region 15 towards impurity region 16, as shown, and output terminals 21 and 22 are respectively connected to the second and third electrodes 19 and 30 with a load resistor $R_L$ therebetween through which electrode 20 is also connected to the negative terminal of source E.

It will be apparent that, in the apparatus 10, the first region 15 of P-type conductivity and the second region 16 of N-type conductivity are both forwardly biased by source E so as to positively inject holes and electrons, respectively, into substrate 11, and further that the third region 17 of P-type conductivity is reverse biased by source E, and hence adapted for collecting the holes at the first impurity region 15.

Figure 2A:
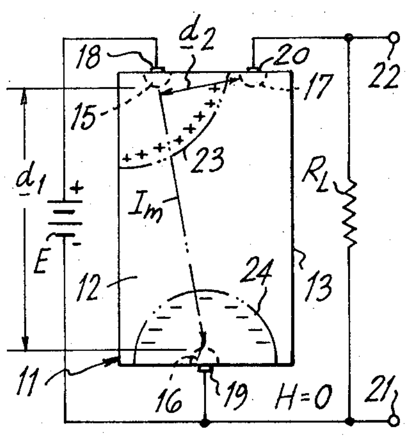
FIG. 2A,2B and 2C are schematic diagrams to which reference will be made in explaining the operation of the apparatus of FIG. 1.

In accordance with this invention, the distance $d_1$ (FIG. 2A) between the first and second impurity regions 15 and 16 in substrate 11 is made larger than the sum of the diffusion lengths $L_{DH}$ and $L_{DE}$ of the carriers, that is, the holes and electrons, injected into substrate 11 at regions 15 and 16, respectively. Further, in accordance with this invention, the third impurity region 17 is closer to the first region 15 than to the second region 16 and is spaced from the path of the main current flow $I_m$ by a distance $d_2$ which, in the absence of a magnetic field, is greater than the diffusion length $L_{DH}$ of the carriers, that is the holes, injected at the first region 15.

With the apparatus 10 as described above, it is found that the exposure of the semiconductor element to a magnetic field having magnetic flux directed substantially normal to surface 12, for example, as indicated by the arrow H+ or H—, will produce a significant change in the current flowing through load resistor $R_L$. More specifically, the current flowing through load resistor $R_L$ will be significantly larger when the semiconductor element is exposed to a magnetic field having its flux in the direction of the arrow H+ than the current flowing in the load resistor when no magnetic field is present, and the exposure of the semiconductor element to a magnetic field having its flux in the direction of the arrow H— will result in a current flow through the load resistor that is significantly smaller than the current flow therethrough when no magnetic field is present.

Figure 2B:
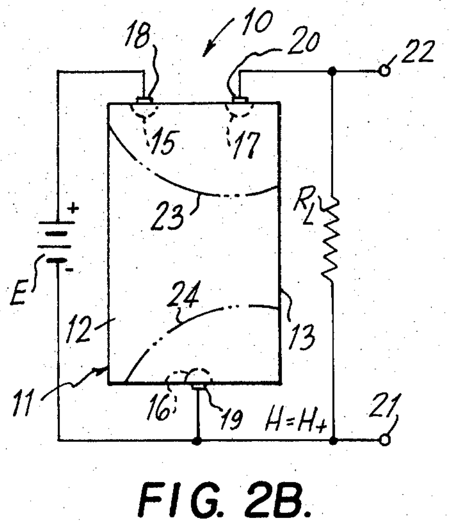
Figure 2C:
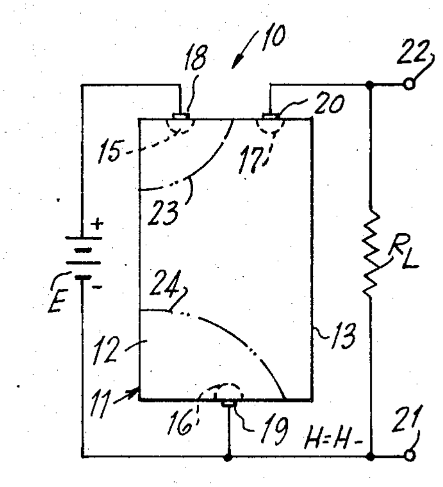

The above operation of the magnetic field detecting apparatus 10 results from the fact that, when no magnetic field is present (FIG. 2A), low resistance zones 23 and 24 of substantially uniform potential having high concentrations of the holes and electrons, respectively, injected at impurity regions 15 and 16 are limited to areas extending around such regions, with plasma being produced between such zones 23 and 24. Thus, the main current flows between the first and second electrodes 18 and 19 and only an extremely small current flows between the first and third electrodes 18 and 20 by reason of the high impedance therebetween. In the presence of a magnetic field having its flux in the direction of the arrow H+ (FIG. 2B) the holes and electrons injected into substrate 11 are drawn by Lorentz's force due to the magnetic field toward the right, as viewed on FIG. 2B, so that the zone 23 of substantially uniform potential and low resistance originating around region 15 is extended to include region 17 and thereby reduces to a low value the impedance between the first and third electrodes 18 and 20. By reason of such low impedance, the current I then flows mostly from the first electrode 18 to the third electrode 20 to produce a relatively large output current through load resistor $R_L$. In the presence of a magnetic field having its flux in the direction of the arrow H— (FIG. 2C), the zones 23 and 24 of low resistance and substantially uniform potential formed around regions 15 and 16 by the injected holes and electrons are drawn toward the left, as viewed on the drawing, whereby the impedance between the first and third electrodes 18 and 20 is further increased to cause a decrease in the output as compared with that experienced when no magnetic field is present. Although the apparatus of FIG. 1 detects magnetic fields having their flux in the direction of the arrows H+ and H—, such detecting apparatus has an asymmetrical characteristic, that is, the increase in the output resulting from the presence of a field having its flux in the direction of the arrow H+ is substantially greater than the decrease in the output resulting from the presence of a magnetic field having its flux in the direction of the arrow H−.

In the case of a magnetic field detecting apparatus according to this invention and having its semiconductor element dimensioned as described above, I have found that, with the source E having an EMF of 3 volts, the main current $I_m$, in the absence of a magnetic field (FIG. 2A), is approximately 30 milliamperes and, for a load resistor $R_L$ having a value of 100 ohms, the measured output current flowing therethrough is 0.4 milliamperes. When the semiconductor element is subject to a magnetic field H+ having a strength or intensity of 1kOe (FIG. 2B), the measured output current is increased to 0.5 milliamperes, that is, a 25 percent increase over the output current in the absence of a magnetic field. On the other hand, when the semiconductor element is subject to a magnetic field H-having a strength or intensity of 1kOe (FIG. 2C), the measured output current is reduced to 0.33 milliamperes, that is, a 17.5 percent decrease from the output current in the absence of a magnetic field. This sensitivity is several times that of the aforementioned SMD magnetoresistance element, and is, of course, so high as not to be comparable with that of Hall generators.

Further, it should be noted that, when the substrate 11 is of substantially intrinsic semiconductor material, the concentrations of holes and electrons therein are substantially equal. Thus, the magnetic field deflects holes and electrons to the same extent so that a Hall field does not arise to produce a force in opposition to that of the magnetic field. Accordingly, it will be seen that the magnetic field detecting apparatus according to this invention not only does not rely upon the Hall effect for its operation, but is preferably provided with an intrinsic substrate 11 to positively avoid the occurrence of the Hall effect and thereby to achieve enhanced sensitivity.

However, even if the substrate is of weakly extrinsic semiconductor material, the positive injection of holes and electrons thereinto from the high impurity regions 15 and 16 is effective to substantially lower the effect of the Hall voltage or field in opposition to the magnetic field. The foregoing results from the fact that the adverse effect of the Hall field or voltage is minimized when $$n+p/n-p>>1$$

in which $n$ and $p$ are the numbers of holes and electrons per unit volume in the semiconductor material. Since the positively injected holes and electrons are added to the holes and electrons present in the weakly extrinsic substrate, the effect of the injected holes and electrons is to increase the value of the above quotient and thereby to reduce the Hall field or voltage.

It will be apparent from the foregoing that the magnetic field detecting apparatus according to this invention relies, for its operation, on the deflection of the injected carriers by a magnetic field. Since the extent of such deflection increases with an increase in the length of the carrier path, it is apparent that the distance $d_1$ between the hole and electron injecting regions 15 and 16 should be as large as possible. However, if the carrier has a short life-time in the substrate 11, the source E has to provide a high voltage. Accordingly, it is desired that the carriers have a long lifetime in substrate 11 and resist recombining so as to have increased diffusion lengths which permit the distance $d_1$ to be relatively large for enhancing the sensitivity without requiring the use of a high voltage source.

Figure 3:
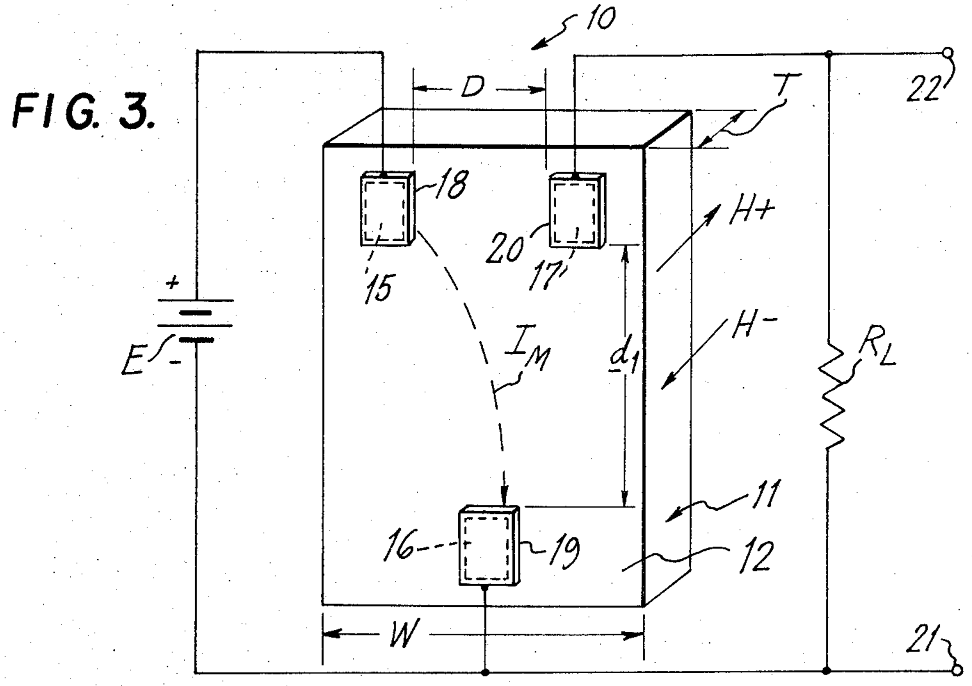
FIG. 3 is an enlarged perspective view schematically illustrating a modification of the apparatus of FIG. 1.

FIG. 3 illustrates another embodiment of this invention, in which parts corresponding to those in FIG. 1 are identified by the same reference numerals. In the embodiment of FIG. 3, the electrodes 18,19 and 20 and the regions 15,16 and 17 corresponding thereto are all formed on the main surface 12 of the substrate 11. This construction is advantageous in that the third region 17 and its electrode 20 can be freely formed at a desired location for selection of any desired sensitivity characteristic of the apparatus.

Figure 4:
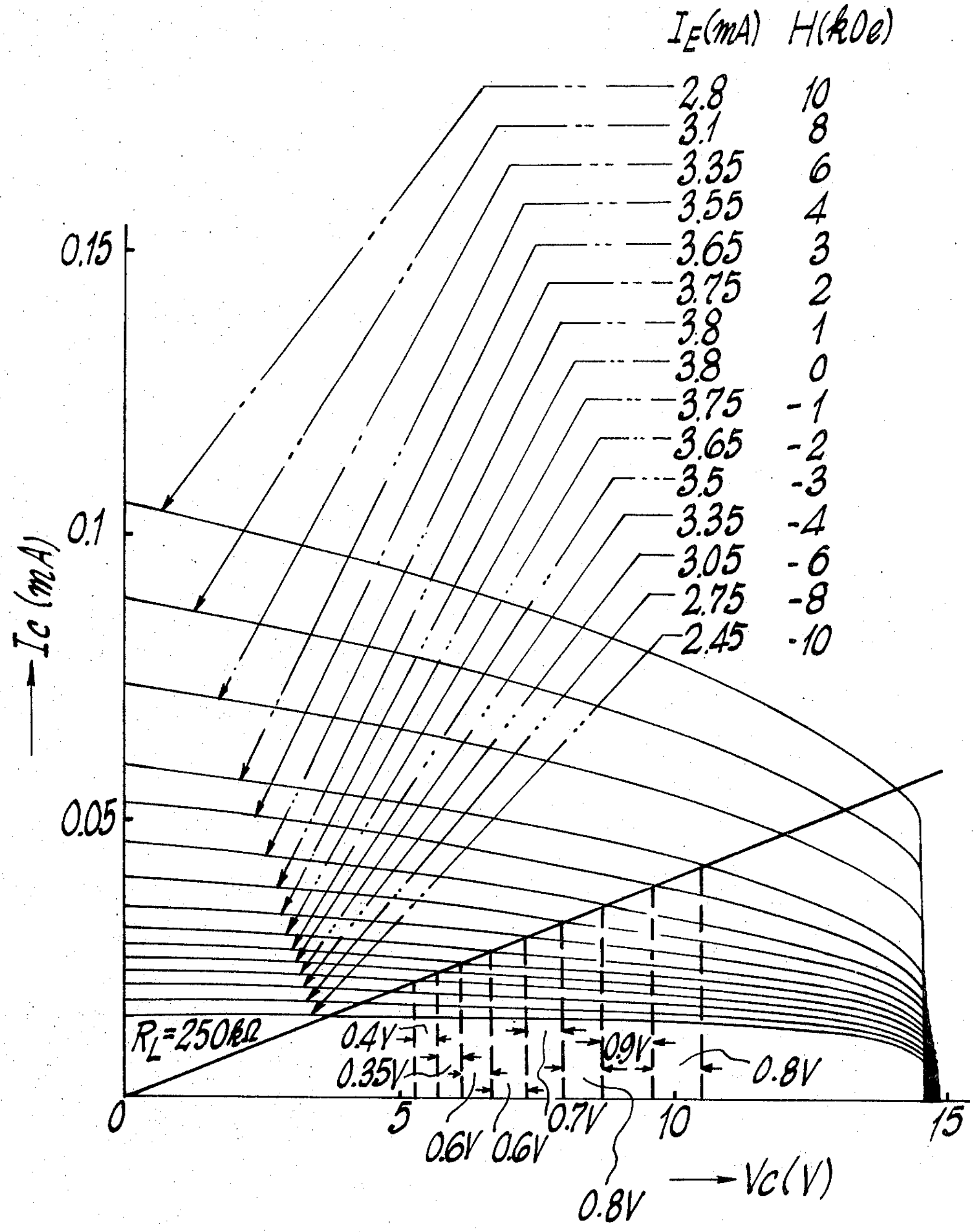
FIGS. 4 and 5 are graphs showing the characteristics of a magnetic field detecting apparatus according to this invention.

FIG. 4 is a graph showing the output voltage-current characteristic of a magnetic field detecting apparatus having the construction shown in FIG. 3, and in which the substrate 11 was of weakly extrinsic N-type silicon having a resistivity from 400 to 600 ohm cm and a thickness T of 70 microns. Further, the regions 15 and 16 were 50 × 50 microns in size, the region 17 measured 50 × 100 microns, the regions 15 and 17 were P-type, the region 16 was N-type, the distance D was 200 microns, and the distance $d_1$ between the regions 15 and 16 was 600 microns, and the power source voltage was 20 volts. With the load resistor $R_L$ having a value of 250 kiloohms, the output voltage of the magnetic field detecting apparatus varied at the rate of 0.8 volts per 1 kOe. When a magnetic field in the range of about ±10 kOe was applied. Thus, even when the magnetic field detecting apparatus according to this invention employs a weakly extrinsic substrate, a relatively very large output is obtained in response to a magnetic field of less than 1 kOe.

Figure 5:
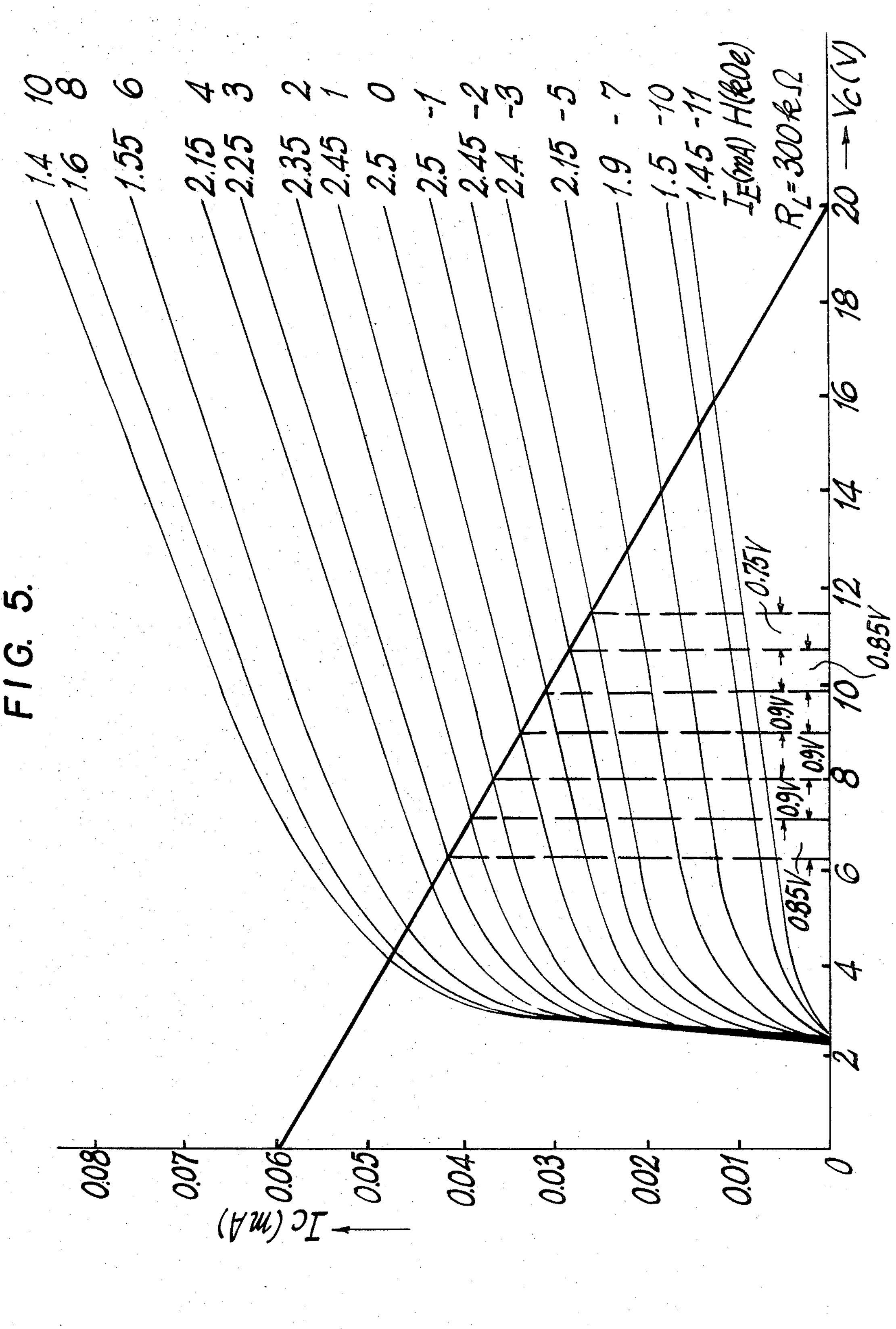

FIG. 5 is a graph showing the output voltage current characteristic of another magnetic field detecting apparatus which is identical to that described above with reference to FIG. 3, but in which the power source is connected in a reverse direction. In this case, the regions 15 and 16 each have a size of 50 × 50 microns; the region 17 has a size of 50 × 150 microns; the regions 15 and 17 are N-type; the region 16 is P-type; the distance D is 250 microns; the distance $d_1$ is 600 microns; and the substrate is a weakly extrinsic N-type semiconductor material having a thickness of 120 microns and a resistivity of 800 to 1,200 ohm cm. With the load resistor being 300 kiloohms, the output voltage varies at the rate of about 0.9 volts per 1 kOe for magnetic fields in the range from +10 kOe to −10 kOe.

It will be seen on FIGS. 4 and 5, that the current $I_c$ from the electrode 20 associated with region 17, in each case, varies with the strength of the applied magnetic field, and that the output voltage $V_c$ is defined at the intersection of each current characteristic curve with the load resistance line.

Figure 6:
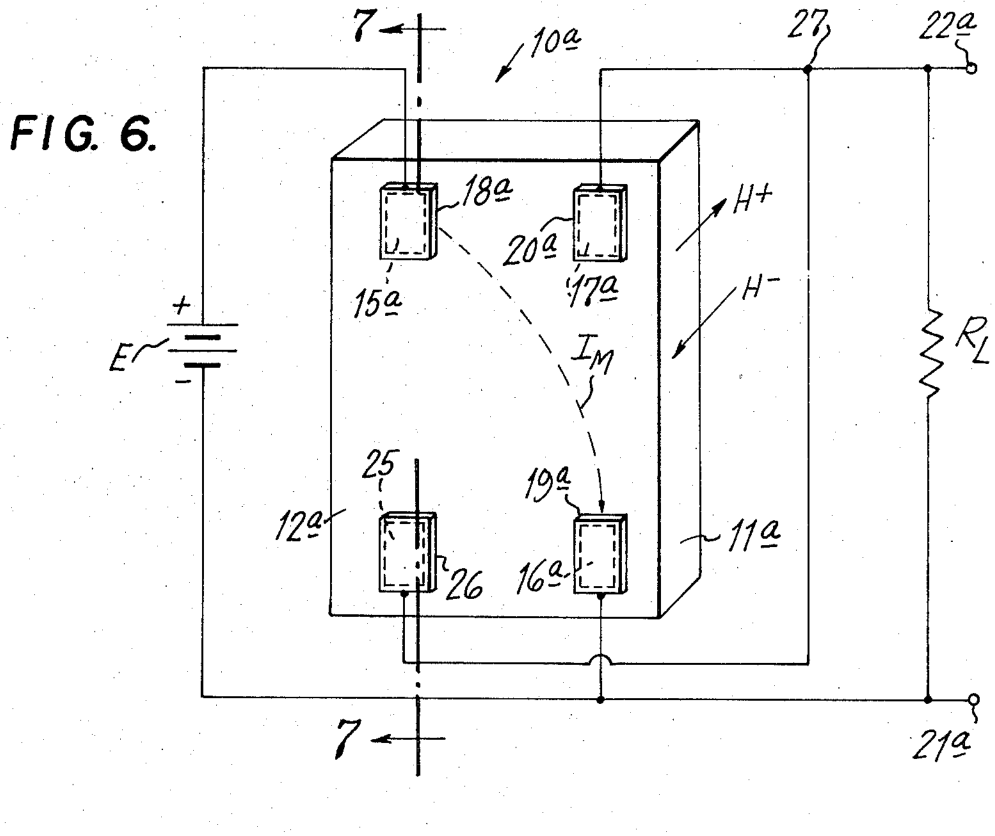
FIG. 6 is a view similar to that of FIG. 3 but showing a magnetic field detecting apparatus according to another embodiment of this invention.

Referring now to FIG. 6, in which there is shown a magnetic field detecting apparatus according to another embodiment of this invention, it will be seen that the various parts of the apparatus are identified by the same reference numerals used to identify the corresponding parts in FIG. 1, but with the letter *a* appended thereto. Thus, the apparatus 10a of FIG. 6 includes a semiconductor element 11a formed of a substantially intrinsic substrate having P-type impurity regions 15a and 17a extending from the major surface 12a at locations spaced from each other adjacent one of the relatively short edges of such surface, and also having N-type impurity regions 16a and 25 extending from surface 12a and being spaced from each other adjacent the other relatively short edge of the surface. As previously, first, second and third electrodes 18a,19a and 20a are soldered to the first, second and third impurity regions 15a,16a and 17a, respectively, and a fourth electrode 26 is soldered to the fourth or additional impurity region 25.

In the apparatus of FIG. 6, the electric power source E has its positive and negative terminals respectively connected to first and second electrodes 18a and 19a to forwardly bias regions 15a and 16a and produce a main current flow $I_m$ in substrate 11a which, in the absence of a magnetic field, is in the direction from impurity region 15a toward impurity region 16a, as shown. Output terminal 22a is connected to a junction or connection point 27 between the third and fourth electrodes 20a and 26, and output terminal 21a is connected to second electrode 19a with the load resistor $R_L$ being connected between the two output terminals.

It will be apparent that the forwardly biased regions 15a and 16a inject respective carriers, namely holes and electrons, into substrate 11a, and that the regions 17a and 25 are reverse biased so as to be adapted to collect the holes and electrons injected by the regions 15a and 16a, respectively. The relative positions of regions 15a, 16a and 17a are as described above with reference to the regions 15,16 and 17 of FIG. 1, and the fourth region 25 is located closer to the second region 15a and is spaced from the path of the main current $I_m$ by a distance which, in the absence of a magnetic field, is greater than the diffusion length of the carriers, that is, electrons, injected at the second region 16a. Further, in the embodiment of FIG. 6, the third and fourth impurity regions 17a and 25 are disposed at opposite sides of the path of main current $I_m$.

In the absence of a magnetic field, the lower resistance zones of substantially uniform potential formed around regions 15a and 16a do not extend as far as the regions 17a and 25, respectively, so that the impedances between regions 15a and 17a and between regions 16a and 25 are relatively high and the main current $I_m$ flows between regions 15a and 16a. Thus, a predetermined voltage which depends upon the impedance between the first and third electrodes 18a and 20a and that between the second and fourth electrodes 19a and 26, is derived at the third electrode 20a. In the presence of a magnetic field having its flux in the direction of the arrow H+, the injected holes and electrons are drawn by the Lorentz's force to the right, as viewed on FIG. 6, so that the low resistance zone of equal potential formed by the injected holes includes the regions 15a and 17a connected with the first and third electrodes 18a and 20a. In this case, the impedance between the first and third electrodes 18a and 20a is smaller than that in the absence of a magnetic field, but the impedance between the second and fourth electrodes 19a and 26 is greater than that in the absence of a magnetic field, with the result that the output voltage derived from the third electrode 20a is greater than that in the absence of a magnetic field. In the presence of a magnetic field having its flux in the direction of the arrow H−, the injected holes and electrons are drawn to the left by the Lorentz's force, with the result that the impedance between the first and third electrodes 18a and 20a is higher than that in the absence of a magnetic field and the impedance between the second and fourth electrodes 19a and 26 is lower than that in the absence of a magnetic field, so that the output voltage derived from the third electrode 20a is lower than that in the case of no magnetic field. Thus, the output voltage is dependent upon the impedances between the first and third electrodes 18a and 20a and between the second and fourth electrodes 19a and 26. It will be apparent to those skilled in the art that the sensitivity of the above apparatus may vary with changes in the size of the substrate 11a and in the positions of the electrodes to readily provide an asymmetrical characteristic if desired.

In magnetic field detecting apparatus of the types described above with reference to FIGS. 3 and 6, the sensitivity to a magnetic field, that is, the extent of the change in output experienced in the presence of a weak magnetic field, is enhanced by limiting the current flow through the substrate 11 or 11a parallel to the magnetic flux to be sensed, that is in the direction of the arrows H+ and H−, as such current flow does not contribute to the carrier movement and therefore does not affect the output voltage. Therefore, in order to obtain increased sensitivity, particularly with respect to weak fields, it is desirable to afford a path for the carriers in the substrate which has a small dimension or thickness in the direction of the magnetic flux H+ or H−, that is, normal to the surface 12 or 12a. If the carrier path is provided with the desired small dimension in the direction of the magnetic flux H+ or H− by correspondingly reducing the thickness T of the substrate to such small dimension, for example, to a thickness of about 10 microns, the substrate is then of insufficient mechanical strength to resist breakage when subjected to even normal handling. In fact, a suitable mechanical strength of the substrate requires that it have a thickness of not much less than approximately 150 microns.

Figure 7:
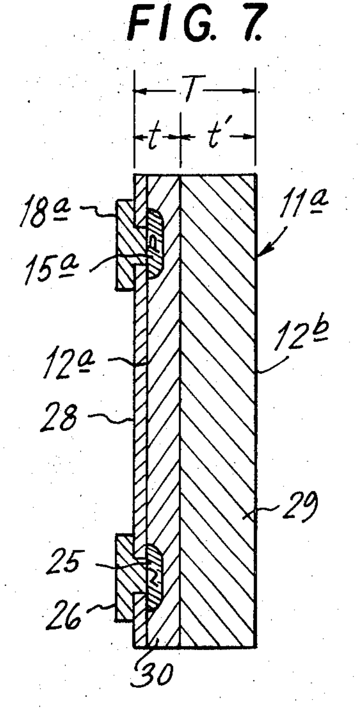
FIG. 7 is a sectional view taken along the line 7—7 on FIG. 6, but showing the semiconductor element according to another embodiment of this invention.

Referring now to FIG. 7, it will be seen that, in accordance with the present invention, the semiconductor element of a magnetic field detecting apparatus, for example, of the type illustrated by FIG. 6, is provided with a carrier path of sufficiently small dimension in the direction of the magnetic flux to be detected to provide high sensitivity without similarly reducing the overall thickness of the semiconductor substrate. As shown on FIG. 7, the surface 12a of substrate 11a may be coated with an insulating layer 28, for example, of $SiO_2$, provided with windows or openings, as by photo-etching. The P- and N-type regions 15a,16a,17a and 25 of which only the regions 15a and 25 appear in the sectional view of FIG. 7, are formed at the openings of layer 28, as by the diffusion technique, and then have the respective electrodes 18a,19a,20a and 26 applied thereto.

The substrate 11a having the impurity regions 15a, 16a,17a and 25 extending from one of its major surfaces 12a is further provided with an impurity region 29 extending from the opposite major surface 12b and which contains a so-called "Killer" or "Deathnium" impurity, such as, for example, gold, copper, nickel, silver, zinc, manganese, iron or platinum. Such "Killer" or "Deathnium" impurities provide recombination centers for the carriers in the substrate so that the corresponding region 29 of the substrate does not afford a flow path for the carriers. The region 29 may be formed in substrate 11*a* by diffusion of the "Killer" or "-Deathnium" impurity therein from the surface 12*b*.

In a specific example of the embodiment of the invention shown on FIG. 7, the substrate 11*a* may be formed with a thickness T of 150 microns and have its impurity regions 15*a*,16*a*,17*a* and 25 formed by diffusion from surface 12*a* to a depth of about 3 microns, and gold, as the "Killer" or "Deathnium" impurity, is evaporated on the surface 12*b* and then diffused into the substrate by heating at a temperature from about 850°C. to 900°C. until the gold is diffused into the substrate to a depth *t'* of about 140 microns so as to leave the remaining portion 30 of the substrate with a desired thickness *t* of about 10 microns. After diffusion of the gold into region 24, the remaining layer of gold on surface 12*b* and a thin portion of region 29 immediately adjacent surface 12*b* are preferably removed, as by etching. If such removal is not effected, the layer of gold remaining on surface 12*b* after diffusion and the immediately adjacent thin portion of impurity region 29, which have high conductivities, may form a flow path for the carriers which pass through the region 29 and thereby produce an undesirable current.

In place of the above described diffusion of the gold or other "Killer" impurity into the region 29 of the substrate, such "Killer" impurity may be doped into the substrate 11*a* to form the region 29 by the ion-implantation doping technique.

Figure 8:
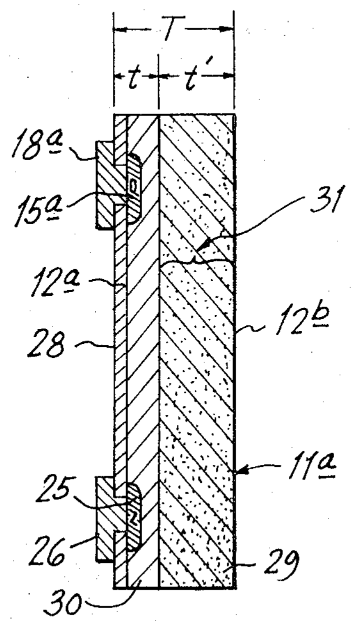
FIG. 8 is a view similar to FIG. 7, but showing the semiconductor element according to another embodiment of this invention.

Further, as shown on FIG. 8, when the diffusion technique is employed for providing the region containing the "Killer" impurity, the substrate 11*a* is advantageously formed, prior to the diffusion, with a polycrystalline layer, as indicated at 31, extending from surface 12*b* to a depth approximately equal to the desired thickness *t'* of required "Killer" impurity region 29. With such polycrystalline layer 31 provided in the substrate 11*a*, the diffusion speed of the "Killer" impurity from a layer thereof evaporated on surface 12*b* is very much greater in the polycrystalline layer 31 than in the remaining monocrystalline region 30 of the substrate. Thus, if the diffusion is conducted for a suitably short period of time, almost all of the "Killer" impurity is diffused into only the polycrystalline layer 31 to create the "Killer" impurity region 29, while the remaining region 30 of the substrate which defines the flow path for the carriers is sharply defined and of a precisely predetermined small thickness *t*.

Figure 9:
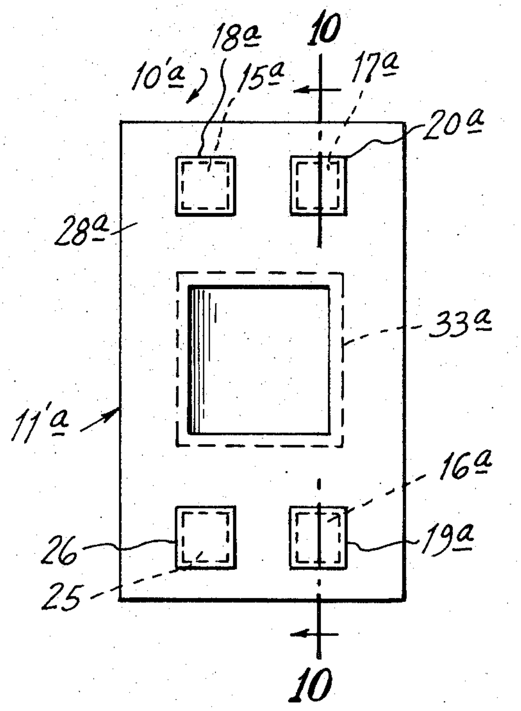
FIG. 9 is a plan view of a semiconductor element according to still another embodiment of the invention.
Figure 10:
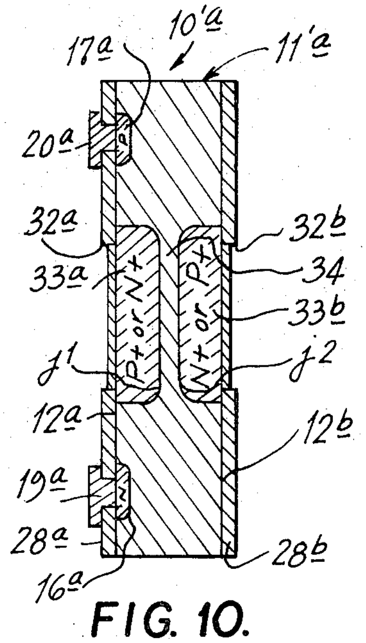
FIG. 10 is a sectional view taken along the line 10—10 on FIG. 9.

Referring now to FIGS. 9 and 10, it will be seen that a semiconductor element 10'*a* of the type shown on FIG. 6 may, in accordance with another embodiment of this invention, be provided with insulating layers 28*a* and 28*b* on the opposed major surfaces 12*a* and 12*b* of the semiconductor substrate 11'*a*. As in the embodiment of FIG. 7, the impurity regions 15*a*, 16*a*,17*a* and 25 are formed in the substrate through openings photoetched in the layer 28*a* on surface 12*a*, and the respective electrodes 18*a*,19*a*,20*a* and 26 are applied to such regions for connection of leads thereto. Further, in this embodiment, a portion of insulating layer 28*a* between electrodes 18*a* and 20*a* and electrodes 19*a* and 26 is formed with an opening 32*a* and a similarly located opening 32*b* is formed in insulating layer 28*b*, and P-type or N-type high impurity density regions 33*a* and 33*b* are formed in substrate 11'*a*, as by diffusion from the surface 12*a* and 12*b*, respectively, using the insulating layers 28*a* and 28*b* as diffusion masks. The regions 33*a* and 33*b* provide junctions $j_1$ and $j_2$ at their respective boundries with the portion 34 of the substrate 11'*a* therebetween. The junctions $j_1$ and $j_2$ prevent the injected carriers, for example, the carriers injected by the first region 15*a*, from passing over the boundries of the regions 33*a* and 33*b* and, therefore, the flow path for the carriers is substantially limited to the small thickness of the substrate region 34.

It is further possible to provide electrodes (not shown) in ohmic contact with the regions 29*a* and 29*b* and to apply a bias voltage to such electrodes so as to vary the effective distance between the junctions $j_1$ and $j_2$.

In a modification of the embodiment shown on FIGS. 9 and 10, the high impurity density region 33*a* may be omitted, so that only the high impurity density region 33*b* is provided extending from the surface 12*b* to limit or reduce the thickness of the path afforded by the substrate for movement therethrough of the carriers.

It will be seen that, in each of the embodiments of this invention described with reference to FIGS. 7–10, the path afforded to the carriers in the substrate is limited to a very small thickness in the direction normal to the surfaces 12*a* and 12*b* of the substrate, that is, in the direction of the magnetic flux of fields which are to be detected, whereby to diminish the undesirable currents in the substrate which do not contribute to variation of the output in response to the presence of a magnetic field. Further, such reduction of the thickness of the path afforded to the carriers in the substrate is achieved without correspondingly reducing the thickness of the substrate itself so that the latter may have sufficient mechanical strength to resist breakage.

Although the embodiments of the present invention illustrated on FIGS. 7–10 have been described as being applied to a magnetic field detecting apparatus of the type shown on FIG. 6, it will be understood that the features of this invention shown on FIGS. 7–10 may be similarly applied to apparatus of the type shown on FIG. 3, that is, in which only three impurity regions 15,16 and 17 are provided in the substrate extending from the surface 12 thereof.

Although precise embodiments of the invention have been described in detail herein with reference to the accompanying drawings, it is to be understood that the invention is not limited to those precise embodiments, and that various changes and modification may be effected therein by one skilled in the art without departing from the scope or spirit of this invention.

What is claimed is:

1. A magnetic field detecting apparatus comprising a semiconductor substrate having at least first, second and third spaced apart regions of relatively high impurity concentration formed therein, said first and third regions being of the same conductivity type and said second region being of the opposite conductivity type, a voltage source, means connecting said voltage source with said first and second regions for forwardly biasing each of said first and second regions so that respective carriers are injected at said first and second regions and a main current flow is established along a path between said first and second regions, said first and second regions being spaced apart by a first distance greater than the sum of the diffusion lengths of the carriers injected at said first and second regions, respectively, output circuit means connected with said second and third regions for reverse biasing said third region so that the latter is adapted to collect said carriers injected at said first region and for providing an output voltage between said second and third regions that corresponds to the strength and direction of any magnetic field to which said substrate is subjected, said third region being closer to said first region than to said second region and being spaced from said path of the main current flow by a second distance which, in the absence of any magnetic field, is greater than the diffusion length of said carriers injected at said first region, said substrate having a pair of opposed surfaces and said first, second and third regions all extending from one of said surfaces, and further comprising at least one additional impurity region extending in said substrate from the other of said opposed surfaces to limit the thickness, normal to said surfaces, of the flow path afforded to carriers in said substrate to substantially less than the thickness of said substrate between said opposed surfaces, whereby to increase the sensitivity of said output voltage to said magnetic field while avoiding undue reduction of the mechanical strength of said substrate.

2. A magnetic field detecting apparatus according to claim 3, in which said substrate further has a fourth relatively high impurity concentration region extending from said one surface and being of the same conductivity type as said second region, said fourth region is formed in said substrate closer to said second region than to said first region and is apaced from said path of the main current flow by a distance which, in the absence of a magnetic field, is greater than the diffusion length of said carriers injected at said second region, said third and fourth regions are disposed at opposite sides of said path of the main current flow, and conductive means of low impedance electrically connect said third and fourth regions.

3. A magnetic field detecting apparatus according to claim 3, in which said additional impurity region has diffused therein an impurity which is a killer for said carriers.

4. A magnetic field detecting apparatus according to claim 5, in which said killer impurity is diffused in a polycrystalline layer of said substrate to sharply define said additional impurity region.

5. A magnetic field detecting apparatus according to claim 3, in which said additional impurity region forms a junction at its boundary with the remainder of said substrate.

6. A magnetic field detecting apparatus according to claim 7, in which a second additional impurity region extends in said substrate from said one surface in a portion of the latter between said first, second and third impurity regions and also forms a junction at its boundary with the remainder of said substrate so that said flow path of limited thickness is defined between said junctions formed by the first mentioned additional impurity region and said second additional impurity region.

7. A magnetic field detecting apparatus comprising a semiconductor substrate having at least first, second and third spaced apart regions of relatively high impurity concentration formed therein, said first and third regions being of the same conductivity type and said second region being of the opposite conductivity type, a voltage source, means connecting said voltage source with said first and second regions for forwardly biasing each of said first and second regions so that respective carriers are injected at said first and second regions and a main current flow is established along a path between said first and second regions, said first and second regions being spaced apart by a first distance greater than the sum of the diffusion lengths of the carriers injected at said first and second regions, respectively, and output circuit means connected with said second and third regions for reverse biasing said third region so that the latter is adapted to collect said carriers injected at said first region and for providing an output voltage between said second and third regions that corresponds to the strength and direction of any magnetic field to which said substrate is subjected, said third region being closer to said first region than to said second region and being spaced from said path of the main current flow by a second distance which, in the absence of any magnetic field, is greater than the diffusion length of said carriers injected at said first region, and in which said substrate further has a fourth region of relatively high impurity concentration which is of the same conductivity type as said second region, said fourth region is located closer to said second region than to said first region and is spaced from said path of the main current flow by a distance which, in the absence of a magnetic field, is greater than the diffusion length of said carriers injected at said second region, said third and fourth regions are disposed at opposite sides of said path of the main current flow, and said fourth region is electrically connected with said third region through conductive means of low impedance for reverse biasing of said fourth region so as to adapt the latter for collecting said carriers injected at said second region.

* * * * *